United States Patent [19]

Campanelli et al.

[11] Patent Number: 5,034,083
[45] Date of Patent: Jul. 23, 1991

[54] PROCESS AND APPARATUS FOR ASSEMBLING SMALLER SCANNING OR PRINTING ARRAYS TOGETHER TO FORM AN EXTENDED ARRAY

[75] Inventors: Michael R. Campanelli, Webster; Donald J. Drake, Rochester, both of N.Y.

[73] Assignee: Xerox Corporation, Stamford, Conn.

[21] Appl. No.: 422,220

[22] Filed: Oct. 16, 1989

[51] Int. Cl.$^5$ .............................................. B32B 31/28
[52] U.S. Cl. .............................. 156/273.5; 156/275.5; 156/275.7; 156/285; 156/297; 156/379.7; 156/379.8; 430/22; 430/321; 430/322
[58] Field of Search ..................... 156/633, 643, 272.2, 156/273.5, 275.5, 275.7, 285, 379.7, 379.8, 552, 297; 430/22, 321, 322

[56] References Cited

U.S. PATENT DOCUMENTS

| | | |
|---|---|---|
| 4,388,128 | 6/1983 | Ogawa et al. ........................... 156/64 |
| 4,523,102 | 6/1985 | Kazufumi et al. ................... 250/578 |
| 4,661,191 | 4/1987 | Kamio et al. ..................... 156/275.5 |
| 4,698,113 | 10/1987 | Ogawa ............................. 156/275.7 |
| 4,814,296 | 3/1989 | Jedlicka et al. ...................... 437/226 |
| 4,976,802 | 12/1990 | LeBlanc ....................... 156/275.5 X |

Primary Examiner—Caleb Weston
Assistant Examiner—Michele K. Yodee
Attorney, Agent, or Firm—Frederick E. McMullen

[57] ABSTRACT

Process and apparatus for fabricating an extended scanning or printing array in which plural smaller scanning or printing chips are bonded end-to-end onto the surface of a glass substrate having an opaque thermally and/or electrically conductive coating thereon, with the coating removed at discrete sites to allow a photocurable adhesive placed at the sites to be cured through exposure to UV light from underneath the substrate, the photocurable adhesive holding the chips in place while a chip bonding adhesive deposited on the conductive coating where the chips are located is cured to provide a permanent structure.

9 Claims, 6 Drawing Sheets

PROCESS AND APPARATUS FOR ASSEMBLING SMALLER SCANNING OR PRINTING ARRAYS TOGETHER TO FORM AN EXTENDED ARRAY

The invention relates to a process and apparatus for fabricating an extended scanning or printing array, and more particularly to an improved process and apparatus for locating and bonding smaller chips onto a substrate to form an extended scanning or printing array without sacrifice in image or print quality.

Image sensor arrays for scanning document images, such as Charge Coupled Devices (CCDs), typically have a row or linear array of photosites together with suitable supporting circuitry integrated onto silicon. Usually, an array of this type is used to scan line by line across the width or length of a document with the document being moved or stepped in synchronism therewith. Similarly, image printing arrays such as ink jet heads typically comprise a row of ink jets on a supporting structure.

In the above, the image or print resolution of the array is proportional to the ratio of the scan width and the number of photosites or printing elements. Because of the difficulty in economically designing and fabricating long or extended arrays, image or print resolution for the typical array commercially available today is relatively low when the array is used to scan or print a full line. While resolution may be improved by various mechanisms, as for example, by interpolating extra image signals; or by interlacing several smaller arrays with one another in a non-colinear fashion and crossing over from one array to the next, manipulations of this type adds to both the complexity and the cost of the system. Further, single or multiple array combinations such as referred to above usually require more complex and expensive supporting systems.

An extended or full width scanning or printing array with a large packing of co-linear image reading or printing elements to assure high resolution, has been and remains a very desirable but so far unattainable aim. While forming a full length array by assembling several smaller arrays, referred to as chips herein together end-to-end has often been postulated, there has nevertheless existed the problem of successfully fabricating the composite array such that the smaller chips that make up the longer array are in precise and exact alignment, with the chip ends in close abutting relation with one another so that distortion of image or print is avoided.

In the prior art, U.S. Pat. Nos. 4,523,102; 4,388,128; and 4,661,191 to Kazufumi et al, Ogawa et al, and Kamio et al, respectively, disclose processes for bonding color filters to image sensor chips in which a heat activated-ultraviolet curable adhesive is used to bond the color filters to the chip. In these prior art processes, the adhesive is first cured partially by exposing the adhesive to ultraviolet light, with curing completed through the application of heat. These prior art processes are enabled by virtue of the transparent nature of the filter, allowing the ultra violet light to pass through the filter and strike the adhesive. A further prior art disclosure, U.S. Pat. No. 4,698,113 to Ogawa, discloses a process for cementing lens elements in which various types of photocurable-heat activated adhesive combinations are provided which are designed to assure curing of the adhesive where impingement of the ultraviolet rays is prevented by dark bands in the color filter.

In contrast, the present invention provides an improved process for fabricating a longer array from a preset number of smaller chips, the chips being substantially opaque, comprising the steps of: providing a transparent substrate; depositing a thermally and/or electrically conductive film to one surface of the substrate, the film being substantially opaque; photopatterning the film to remove a portion of the film from the substrate and expose at least one area of the substrate under each of the chips; applying a first adhesive to the surface where the chips are to be located, the first adhesive being applied over the conductive film; applying a second adhesive to the exposed substrate areas, the second adhesive comprising a photocurable adhesive; placing the chips in predetermined aligned end-to-end abutting relation with one another on the substrate surface over the first and second adhesives; activating the second adhesive by exposing the second adhesive through the substrate to radiant energy to initially secure the chips in place on the substrate; and while the chips are held in place by the second adhesive, curing the first adhesive to permanently secure the chips in place on the substrate.

The invention further provides an apparatus for assembling an extended image or print array in which a plurality of smaller chips are bonded to a transparent substrate having a thermally and/or electrically conductive coating on one side in which at least one discrete part of the conductive coating has been removed to provide at least one bonding window for each chip, and a chip bonding first adhesive deposited on the coating where the chips are to be located and a photocurable second adhesive deposited at each bonding window, comprising the combination of: a first member for releasably supporting the substrate with the transparency of the substrate at least partially preserved and the substrate one side in a predetermined position for assembly with the chips; a second member having a substantially flat surface for supporting the chips in aligned and abutting end-to-end relation with one another with one side of the chips against the second member surface; chip retaining means for releasably retaining the chips in a predetermined assembled position on the second member surface; means pivotally coupling the first member with the second member so that on relative movement between the first and second members, the opposite side of the chips and the substrate one side are brought into face to face contact with each other and the first and second adhesives; and light means for exposing the substrate while the substrate is supported by the first member, the light passing through the transparent substrate at the bonding windows to activate the second adhesive, whereby on release of the chip retaining means, the second adhesive temporarily secures the chips to the substrate pending activation of the first adhesive.

Figure 1:
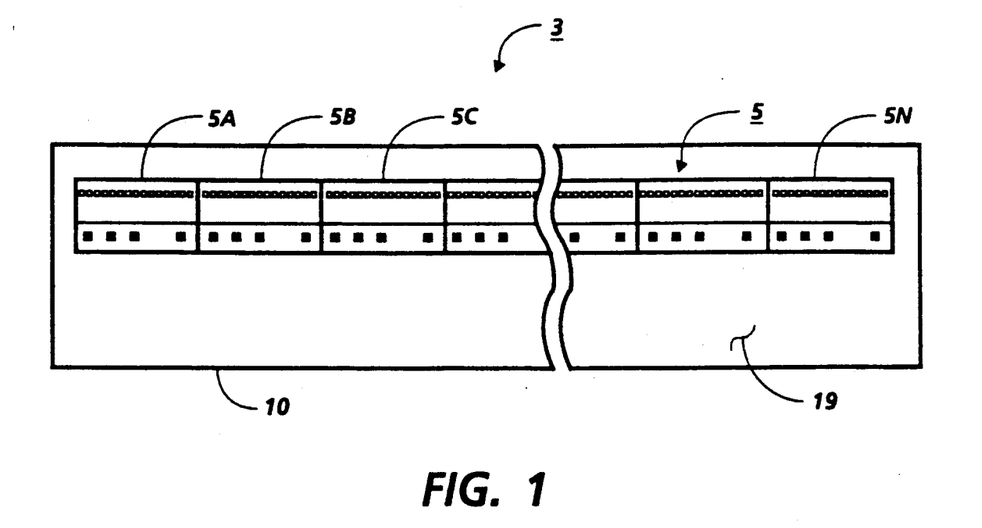
FIG. 1 is a top view illustrating an extended scanning array comprised of plural smaller chips assembled in end-to-end relation and bonded together using the process and apparatus taught by the present invention.

Referring particularly to FIG. 1 of the drawings, there is shown an extended, i.e., full width, scanning array 3 composed of a plurality of smaller sensor chips or arrays 5 assembled end-to-end (specific chips are identified by numerals 5A, 5B, . . . 5N) on an elongated rectangular transparent substrate 10. Substrate 10 comprises any suitable transparent material as, for example, glass, having a thermally and/or electrically conductive film 19 on the surface 18 (seen in FIG. 3) where chips 5 are to be mounted. As will be understood, film 19 is substantially opaque.

As will be understood by those skilled in the art, array 3 is typically used to read or scan a document original line by line and convert the document image to electrical signals. In that application, array 3 preferably is a full width array having an overall length equal to or slightly greater than the width of the largest document to be scanned.

Figure 2:
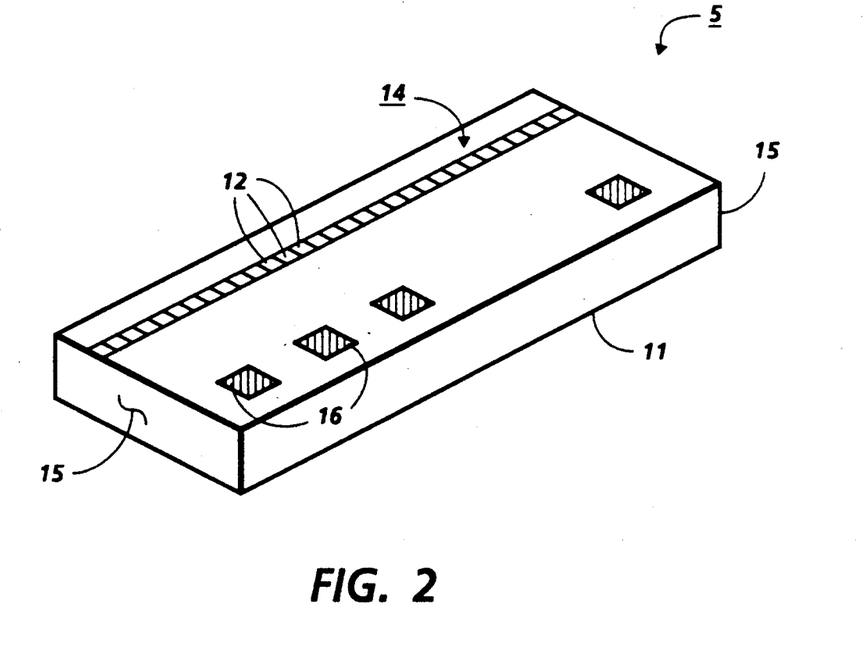
FIG. 2 is an isometric view illustrating a smaller chip of the type used to make the array shown in FIG. 1.

As shown in FIG. 2, chips 5, which may, for example, be Charge Coupled Devices (CCDs), comprise a relatively thin silicon die 11 having a generally rectangular shape. A row 14 of photosites 12 parallels the longitudinal axis of the chips. While a single row 14 of photosites 12 is shown, plural photosite rows may be contemplated. Other active elements such as shift registers, gates pixel clock, etc., are preferably formed integral with die 11. Chips 5 have suitable external connectors, shown here as bonding pads 16, for electrically coupling the chips to external sources. As will be understood, chips 5 are opaque.

Chips 5 are provided with substantially flat, square ends 15 designed to enable chips 5 to be accurately and tightly abutted together with one another without distortion or other defects. Chips suitable for this purpose may, for example, be formed in the manner described in U.S. Pat. No. 4,814,296, issued on Mar. 21, 1989, in the names of Josef E. Jedlicka et al.

When a single chip 5 is used for scanning purposes, the image resolution achieved is a function of the number of photosites 12 that can be fabricated on the chip. Since the number of photosites 12 that can be packed onto a single chip is limited, it is advantageous to assemble plural chips together in a longer array, and preferably in a full width or full size array. In the present invention, an extended array is fabricated from a plurality of chips 5A, 5B, . . . 5N secured together in tightly abutting end-to-end relation, the finished array having a continuous and uninterrupted row of photosites with a substantially uniform periodicity.

Figure 3:
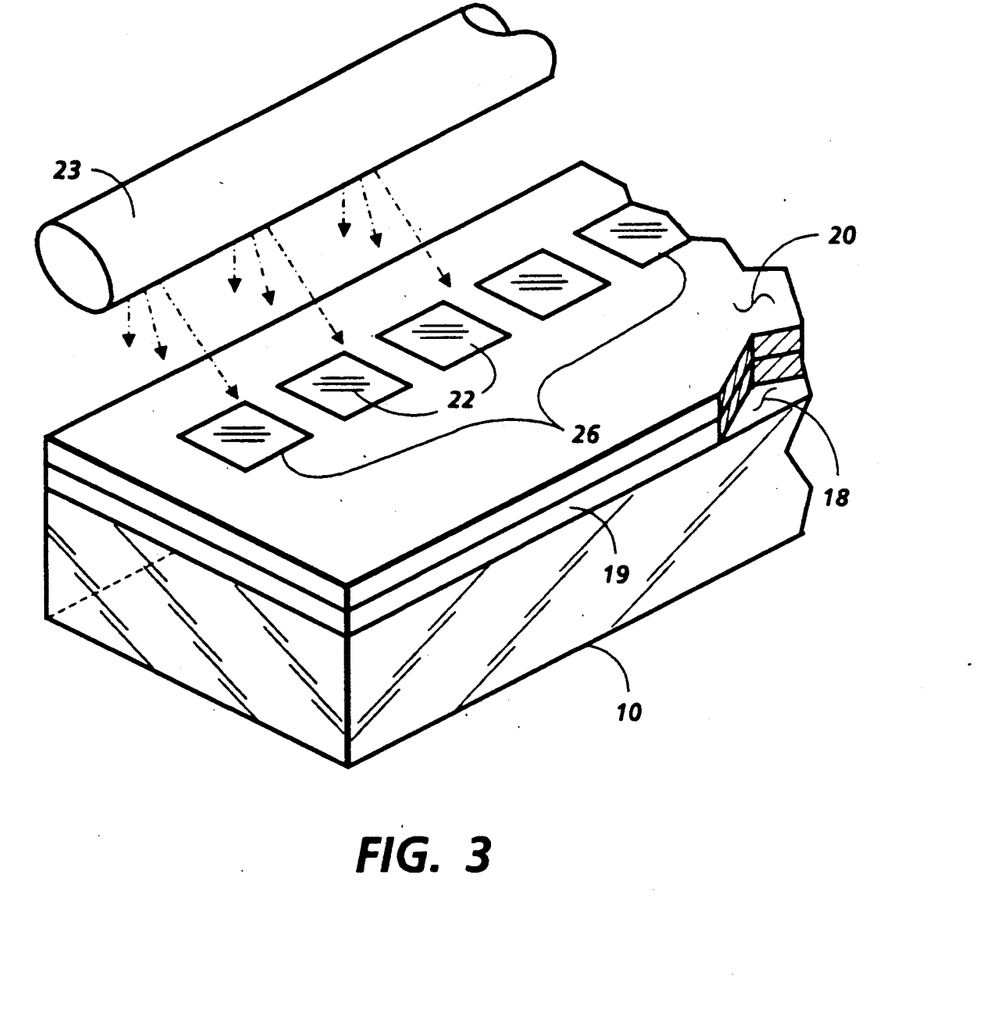
FIG. 3 is an isometric view depicting the first stage of the process of the present invention in which a transparent substrate, following deposition of a thermal and/or electrically conductive film on the surface thereof, is photopatterned to remove discrete areas of the conductive film and open up bonding windows on the substrate.
Figure 4:
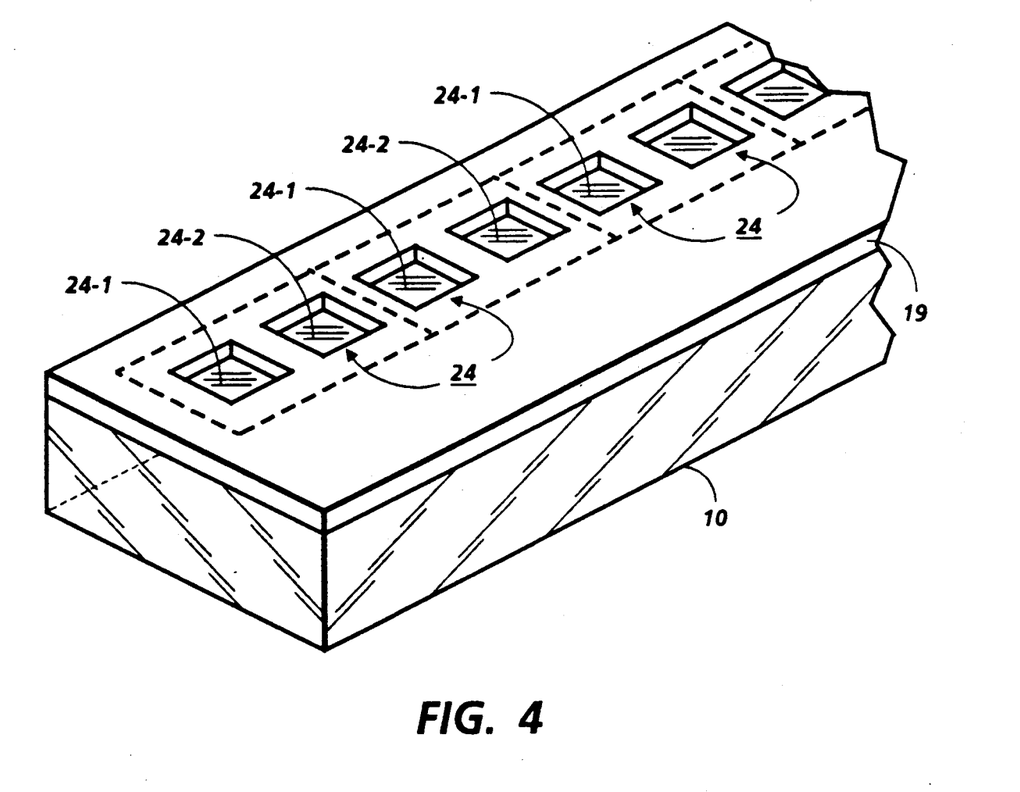
FIG. 4 is an isometric view depicting the substrate following completion of the first stage of the process shown in FIG. 3.

Referring now to FIGS. 3 and 4, in the present invention, the surface 18 of substrate 10 to which film 19 is applied is exposed through a pattern 20. Pattern 20 consists of a suitable opaque material having a plurality of generally rectangular transparent areas 22 arranged in a row 26 and in predetermined spaced relation with one another. The number and location of transparent areas 22 is chosen to provide two optically clear bonding windows 24-1 and 24-2 in film 19 (seen in FIG. 4) for each chip 5A, 5B, . . . 5N to be mounted on substrate 10. Transparent areas 22 of pattern 20 are sized so as to create bonding windows 24 with an area capable of containing a predetermined amount of a photocurable adhesive which is used to initially hold chips 5 in place pending completion of the bonding process as will appear. Because of the delicate nature of bonding items in close proximity (i.e., less than 0.001"), the advantage of a light curable adhesive is that minimal thermal expansion results from the curing process. With heat curable adhesives, there is a risk of heating which results in non-uniform thermal expansion. While two bonding windows 24-1, and 24-2 are shown and described, the number of windows 24 may vary from one to any desired number. Further, the size and shape of windows 24 may be different from that shown and described herein. Other suitable processes for forming bonding windows may be contemplated.

On exposure of substrate 10 through pattern 20, light, as for example from exposure lamp 23 passing through the transparent areas 22 of pattern 20, exposes the portion of film 19 opposite thereto to delineate the area of the bonding windows 24. As will be understood, the remainder of pattern 20, which is opaque, blocks the transmission of light, leaving the other areas of film 19 unexposed. Following predetermined exposure, surface 18 of substrate 10 is chemically treated to remove pattern 20 and the exposed portions of film 19. As a result, a series of optically clear bonding windows 24 are created on the surface 18 of substrate 10 where film 19 is removed as shown in FIG. 4.

Figure 5:
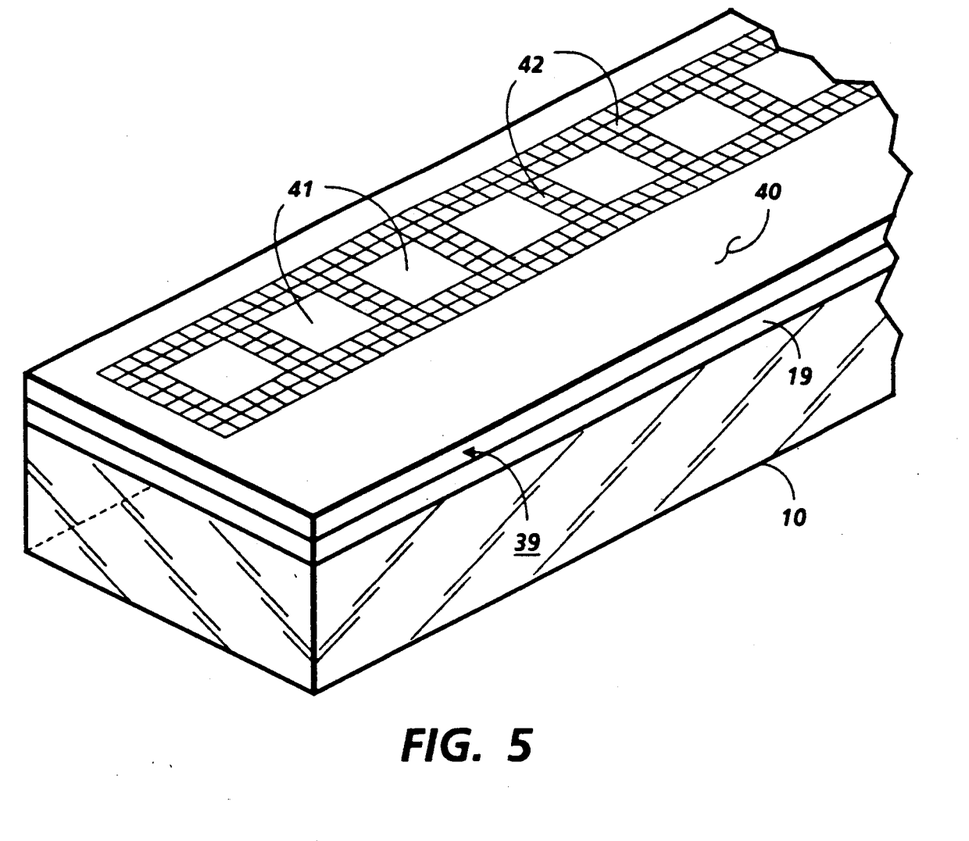
FIG. 5 is an isometric view depicting the second stage of the process of the present invention in which the chip bonding adhesive is screen-printed onto areas of the surface of the substrate where the chips are to be located.
Figure 6:
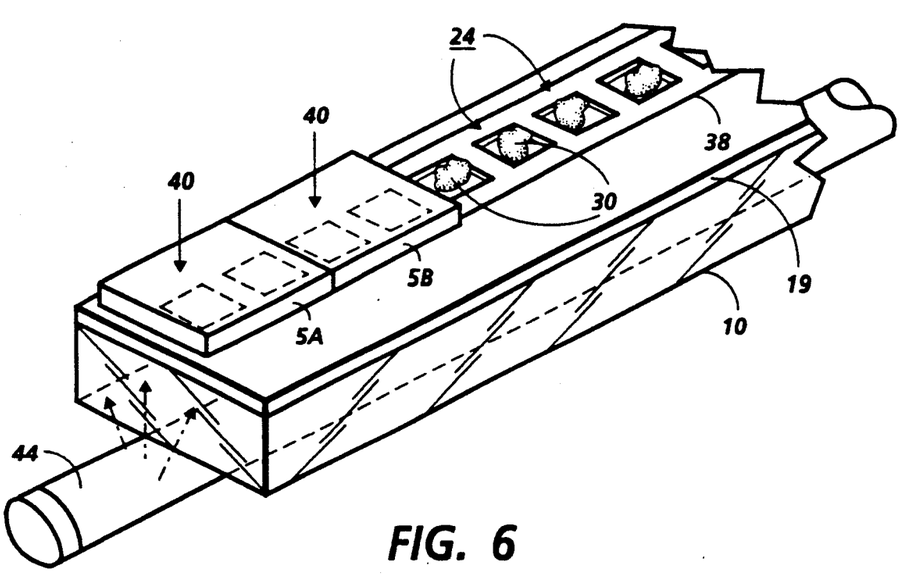
FIG. 6 is an isometric view depicting the third stage of the process of the present invention in which chips are placed in aligned and abutting end-to-end relation on the surface of the substrate following deposition of separate chip bonding and photocurable adhesives thereon.

Referring to FIGS. 5 and 6, a suitable bonding adhesive 38 is dispensed onto the areas of film 19 where chips 5 are to be attached to substrate 10. In order to control deposition of adhesive 38 and prevent application of adhesive 38 to bonding windows 24, a screen 39 having a pattern of opaque areas 40, 41 and screened area 42 is used, screen 39 serving to limit application of adhesive 38 to areas of the substrate 10 where chips 5 are to be located. To prevent application of adhesive 38 to bonding windows 24, the opaque areas 41 are approximately the same size and shape as bonding windows 24, with one opaque area 41 being provided as a cover for each of the bonding windows 24. A suitable photocurable adhesive such as an adhesive 30 curable by ultra violet (UV) light is separably dispensed onto surface 18 of substrate 10 at each of the bonding windows 24. Other suitable processes for depositing adhesives may be contemplated.

Figure 7:
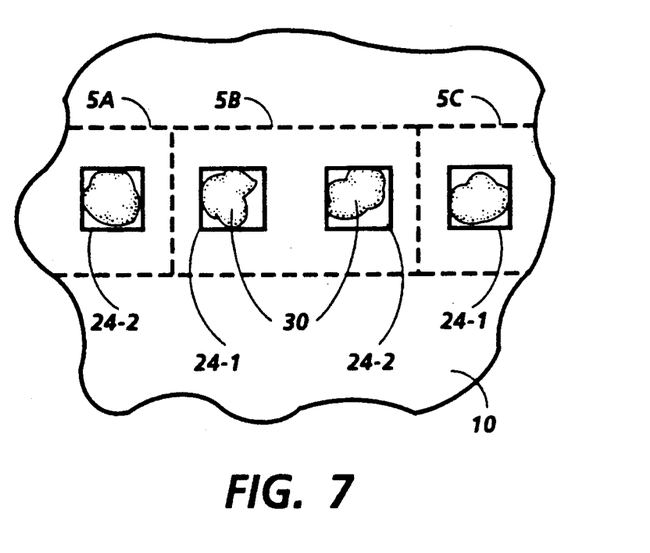
FIG. 7 is a bottom view of the substrate illustrating the optical path provided by the bonding windows that permits curing of the photocurable adhesive through exposure to light.

Referring to FIGS. 6 and 7, following deposition of adhesives 30, 38 on surface 18 of substrate 10, the chips 5A, 5B, . . . 5N that comprise array 3 are placed bottom side down on surface 18 of substrate 10 over adhesives 30, 38, with the ends 15 of chips 5 in tight end-to-end abutting relation with one another. A controlled pressure (designated by the arrow 40) is applied to the chips 5 to force the chips 5 tightly against the surface 18 of substrate 10 and into uniform contact with adhesives 30, 38.

Photocurable adhesive 30 on bonding windows 24 is then exposed by a suitable UV light source 44, light from light source 44 passing through the transparent portion of substrate 10 opposite bonding windows 24 to expose and activate adhesive 30. Exposure of adhesive 30 establishes an initial bond between chips 5 and the substrate 10 which retains the chips 5 in position while adhesive 38 is cured. UV light source 44 may, for example, comprise a UV lamp or scanning UV laser.

Following activation of adhesive 30 and initial bonding of chips 5 to substrate 10, adhesive 38 is cured to permanently bond the chips 5 to substrate 10. Adhesive 38, which typically comprises a thermally activated adhesive, normally requires removal of the partially processed chip-substrate assembly to a suitable oven where controlled heating of the adhesive is performed. The photocurable adhesive 30 retains the chips in place on substrate 10 while the chip-substrate assembly is moved to the curing site and during the curing process.

Figure 8:
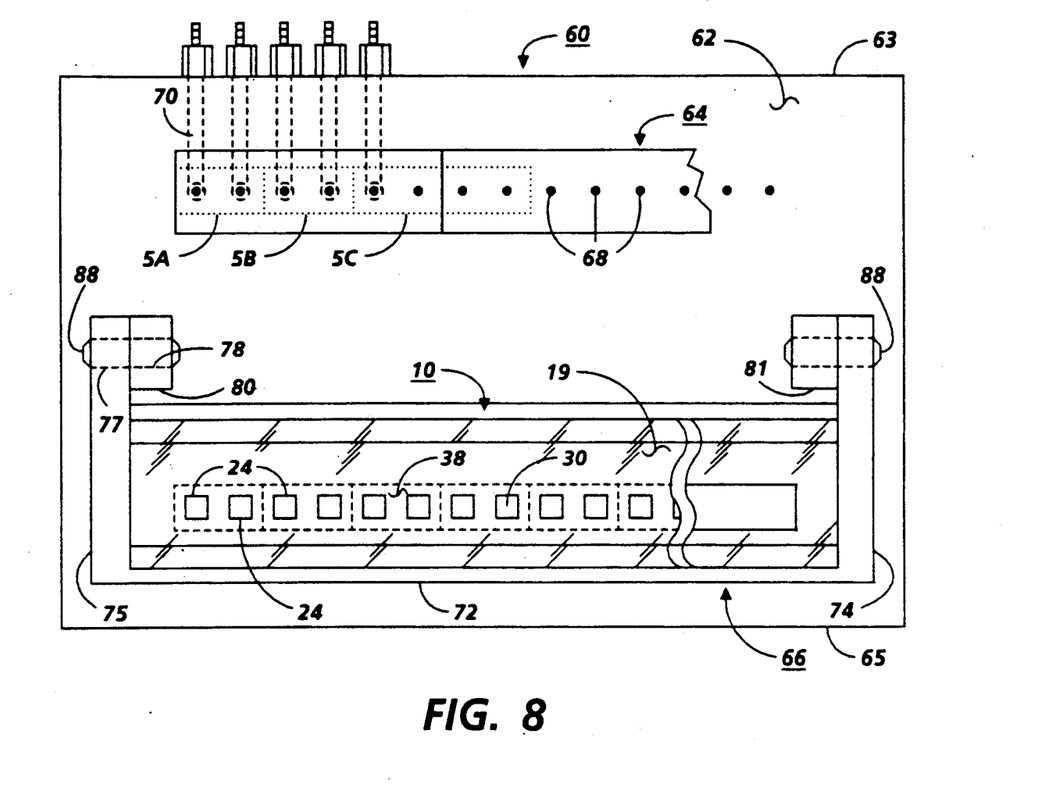
FIG. 8 is a top view illustrating the assembly apparatus of the present invention including a base with vacuum manifold for holding a row of chips in abutting end-to-end relation and substrate support fixture in the open loading position.
Figure 9:
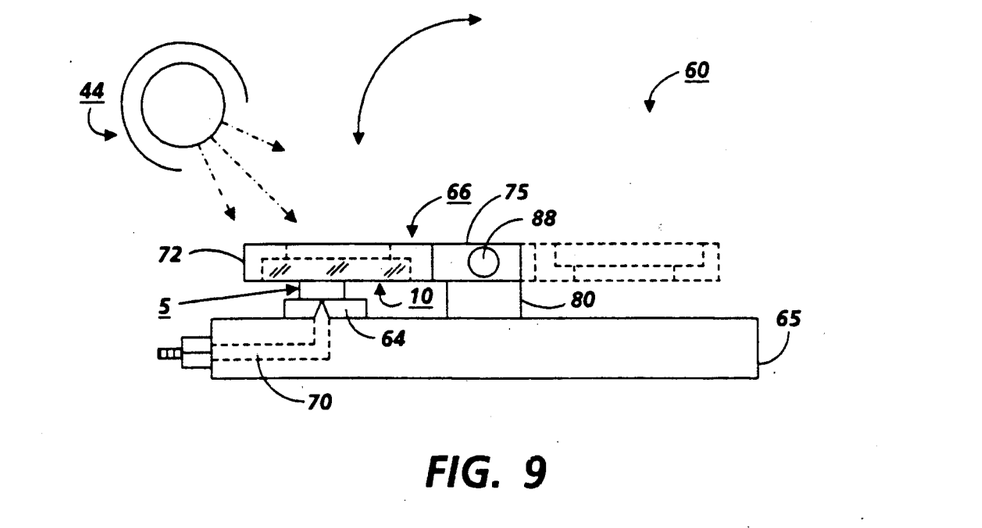
FIG. 9 is a side view in cross section of the apparatus shown in FIG. 8 with the substrate support fixture closed and the substrate abutted against the chips.

Referring to FIGS. 8 and 9 where like numbers refer to like parts, there is shown the assembly apparatus of the present invention, designated generally by the numeral 60, for use in precision fabrication of arrays 3. Apparatus 60 includes a generally rectangular base 62 with an elongated generally rectangular vacuum manifold 64 thereon adjacent one side 63 of base 62 and a pivotable substrate support fixture 66 adjacent the other side 65 of base 62, vacuum manifold 64 and substrate support fixture 66 being located in predetermined operating relation with one another as will appear. Vacuum manifold 64, which serves to retain the row of chips 5A, 5B, . . . 5N that comprise the array 3 in predetermined end-to-end relation during the fabrication process, has a row of vacuum holddown openings or ports 68 in the surface thereof for this purpose. Suitable chip registering and locating guides (not shown) may be provided for locating chips 5 in exact aligned and registered position during the assembly process. Individual vacuum passages 70 in base 60 couple ports 68 with a suitable source of vacuum (not shown), there being a suitable control valve (not shown) to enable vacuum to ports 68 to be turned on and off during the array fabrication process.

Substrate support fixture 66 comprises a generally rectangular open frame 72 within which substrate 10 is located in predetermined fixed position. Sides 74, 75 of frame 72 are extended and are provided with a bore 77 therethrough adjacent the terminal end thereof which, for assembly of substrate support fixture 66 with base 60, aligns with similar bores 78 in spaced apart mounting brackets 80, 81 secured to base 60. Journaling pins 88 fit within bores 77, 78 to pivotally attach substrate support fixture 66 to base 60. When mounted in place on base 60, substrate support fixture 66 is pivotally movable through an approximately 180° arc from the retracted position shown in FIG. 8 (shown also by dotted lines in FIG. 9) to the closed position shown by solid lines in FIG. 9.

UV light source 44 is suitably supported on base 60 such that light from source 44 impinges on the substrate 10 carried by substrate support fixture 66 when fixture 66 is in the closed position. It is understood that UV light source 44 is supported so as to not interfere with pivoting movement of substrate support fixture 66.

In operation, substrate support fixture 66 is placed in the retracted or open position shown in FIGS. 8 and 9. Substrate 10 is inserted into the frame 72, with the surface 18 having the previously prepared film 19 with bonding windows 24 formed therein facing outwardly. Photocurable adhesive 30 is applied to bonding windows 24 and chip bonding adhesive 38 to the remainder of film 19 in the manner described heretofore.

Chips 5A, 5B, . . . 5N that comprise the array 3 are located in registered end-to-end abutting relation on vacuum manifold 64, chips 5 being placed face down on manifold 64. Following placing of chips 5 on manifold 64, vacuum is introduced to ports 68 to retain the chips 5 in registered position.

Substrate support fixture 66 is pivoted from the dotted line position to the solid line position shown in FIG. 9 to bring the adhesive bearing surface of substrate 10 into contact with the row of chips 5 on vacuum manifold 64. With fixture 66 in position, UV lamp 44 is activated and light from lamp 44 passes through substrate 10 at the bonding windows 24 to expose and activate photocurable adhesive 30. Activation of adhesive 30 establishes an initial bond between chips 5 and substrate 10. After a preset interval, vacuum to ports 68 is turned off, freeing chips 5 from vacuum manifold 64. Substrate support fixture 66 with substrate 10 having chips 5A, 5B, . . . 5N bonded thereto is then pivoted in the opposite direction back to the retracted position shown by the dotted lines in FIG. 9. There the substrate 10 with chips 5 attached thereto by adhesive 30 is removed and the partially fabricated chip-substrate assembly removed for curing of adhesive 38.

While fabrication of a scanning array 3 and an apparatus for carrying out such fabrication are shown and described, the teachings of the present invention may be employed to fabricate long or full width printer arrays using a series of smaller ink jet heads, ionographic heads, etc. which have one or more rows of printing elements.

While the invention has been described with reference to the structure disclosed, it is not confined to the details set forth, but is intended to cover such modifications or changes as may come within the scope of the following claims.

I claim:

1. A method of fabricating a longer array from a preset number of smaller chips, said chips being substantially opaque, comprising the steps of:
   (a) providing a transparent substrate;
   (b) depositing a thermally and/or electrically conductive film on one surface of said substrate, said film being substantially opaque;
   (c) photopatterning said film to remove portions of said film from said substrate and expose areas of said substrate where each of said chips are to be located;
   (d) applying a first adhesive to said conductive film adjacent each of said exposed areas where said film has been removed;
   (e) applying a second adhesive to each of said exposed areas where said film has been removed, said second adhesive comprising a photocurable adhesive;

(f) placing said chips in predetermined aligned end-to-end abutting relation with one another on said substrate surface with each of said chips being over at least one of said exposed areas and in contact with said first adhesive adjacent said exposed one exposed area and with said second adhesive on said one exposed area;

(g) activating said second adhesive by exposing said second adhesive through said substrate to radiant energy to initially secure said chips in place on said substrate; and (h) while said chips are held in place by said second adhesive, curing said first adhesive to permanently secure said chips in place on said substrate.

2. A method of fabricating a longer scanning or printing array from a preset number of smaller scanning or printing chips, comprising the steps of:

(a) providing a transparent substrate having a surface for supporting said chips;

(b) applying a first adhesive to said substrate surface at discrete sites on said substrate surface in a predetermined pattern so that there is at least one site of said first adhesive for each chip, said sites being smaller than said chips, said first adhesive comprising a photocurable adhesive;

(c) depositing a thermally and/or electrically conductive film on said substrate surface except for said sites;

(d) applying a second adhesive to said film adjacent said sites where said chips are to be placed;

(e) placing said chips in predetermined aligned end-to-end abutting relation with each other on said substrate surface over said first and second adhesives whereby both said first and second adhesives are in contact with said chips;

(f) exposing said first adhesive to radiant energy through said substrate to activate said first adhesive and secure said chips in place on said substrate; and (g) curing said second adhesive to secure said chips in place on said substrate.

3. A process for forming an extended array of scanning or printing elements by assembling a plurality of smaller scanning or printing chips in aligned abutting end-to-end relation with one another, said chips having at least one row of scanning or printing elements, comprising the steps of:

(a) depositing a thermally and/or electrically conductive film on one side of a transparent substrate;

(b) exposing said film to a predetermined pattern of radiant energy to remove said film from a plurality of discrete areas on said substrate where said chips are to be placed, there being at least one of said discrete areas for each of said chips;

(c) depositing chip attaching adhesive onto said film where said chips are to be placed while avoiding deposition of said chip attaching adhesive on said discrete areas;

(d) apply a photocurable adhesive to each of said discrete areas;

(e) placing said chips in predetermined aligned position and in end-to-end abutment with one another on said substrate one side and over said chip attaching and photocurable adhesives;

(f) exposing the opposite side of said substrate to ultra violet light such that the light strikes said substrate opposite said discrete area where said film is removed and passes through said substrate to cure said photocurable adhesive and initially secure said chips in place on said substrate; and (g) activating said chip attaching adhesive to permanently secure said chips in place on said substrate.

4. The process according to claim 1 including the steps of:

(a) holding said substrate in preset fixed position with said one side of said substrate exposed;

(b) pre-locating said chips in end-to-end abutting relation with one another at a location separate from said substrate;

(c) bringing said pre-located chips into said predetermined aligned position on said substrate one side.

5. The process according to claim 4 including the step of:

holding said chips in said preselected aligned position on said substrate one side by vacuum.

6. Apparatus for assembling an extended image or print array in which a plurality of smaller chips are bonded to a transparent substrate having a thermally and/or electrically conductive coating on one side in which at least one discrete part of the conductive coating has been removed to provide at least one bonding window for each chip, comprising the combination of:

(a) a first member for releasably supporting said substrate with the transparency of said substrate at least partially preserved and said substrate one side in a predetermined position for assembly with said chips;

(b) first adhesive applying means for depositing a first chip bonding adhesive on said coating where said chips are to be located;

(c) second adhesive applying means for depositing a photocurable second adhesive at each of said bonding windows;

(d) a second member having a substantially flat surface for supporting said chips in aligned and abutting end-to-end relation with one another with one side of said chips against said second member surface;

(e) chip retaining means for releasably retaining said chips in a predetermined assembled position on said second member surface;

(f) means for coupling said first member with said second member so that on relative movement between said first and second members, the opposite side of said chips and said substrate one side are brought into face to face contact with each other and said first and second adhesives; and (g) light means for exposing said substrate while said substrate is supported by said first member, said light passing through said transparent substrate at said bonding windows to activate said second adhesive, whereby on release of said chip retaining means, said second adhesive temporarily secures said chips to said substrate pending activation of said first adhesive.

7. The apparatus according to claim 6 in which said chip retaining means comprises vacuum holddown means.

8. Apparatus for assembling an extended image or print array in which a plurality of smaller chips are bonded to a transparent substrate having a thermally and/or electrically conductive coating on one side in which at least one discrete part of the conductive coating has been removed to provide at least one bonding window for each chip, comprising the combination of:

(a) a first member for releasably supporting said substrate with the transparency of said substrate at least partially preserved and said substrate one side in a predetermined position for assembly with said chips;

(b) first adhesive applying means for depositing a first chip bonding adhesive on said coating where said chips are to be located;

(c) second adhesive applying means for depositing a photocurable second adhesive at each of said bonding windows;

(d) a second member having a substantially flat surface for supporting said chips in aligned and abutting end-to-end relation with one another with one side of said chips against said second member surface;

(e) chip retaining means for releasably retaining said chips in a predetermined assembled position on said second member surface;

(f) means for mounting said first member for movement toward and away from said second member so that on pivoting movement of said first member toward said second member, the opposite side of said chips and said substrate one side are brought into face to face contact with each other and said first and second adhesives; and (g) light means for exposing said substrate while said substrate is supported by said first member, said light passing through said transparent substrate at said bonding windows to activate said second adhesive, whereby said second adhesive temporarily secures said chips to said substrate while said first member is moved away from said second member to enable said first adhesive to be activated.

9. The apparatus according to claim 7 in which said chip retaining means comprises vacuum holddown means.

* * * * *